United States Patent [19]
Tojo et al.

[11] Patent Number: 6,078,137
[45] Date of Patent: Jun. 20, 2000

[54] DISPLAY DEVICE HAVING ANGLED CONNECTOR

[75] Inventors: Kazuhiko Tojo; Tatsuya Yoshino, both of Mobara; Hiroto Komatsu; Kenji Fujino, both of Omiya, all of Japan

[73] Assignee: Futaba Denshi Kogyo K.K., Mobara, Japan

[21] Appl. No.: 08/955,750

[22] Filed: Oct. 22, 1997

[30] Foreign Application Priority Data

Oct. 23, 1996 [JP] Japan .................................. 8-280566

[51] Int. Cl.⁷ ............................ H01J 63/04; H01J 5/50
[52] U.S. Cl. ..................... 313/495; 313/496; 313/318.01
[58] Field of Search ..................... 313/318.01, 318.05, 313/318.12, 495, 496, 497, 309, 422; 362/226, 84, 253, 95, 367; 439/490, 656, 694, 695; 345/74, 75, 47, 103, 60, 62, 66

[56] References Cited

U.S. PATENT DOCUMENTS

5,686,790 11/1997 Curtin et al. ............................. 313/495

*Primary Examiner*—Nimeshkumar D. Patel
*Assistant Examiner*—Joseph Williams
*Attorney, Agent, or Firm*—Oblon, Spivak, McClelland, Maier & Neustadt, P.C.

[57] ABSTRACT

A display panel which can reduce the number of external terminals for a fluorescent display tube and has its simplified assembled structure difficult to cause conduction failure. The base substrate of the container for a fluorescent display tube protrudes partially outward. Conductors electrically connected to the electrodes inside the container are derived out from the container to electrically connect to the external electrodes on the substrate. Connection terminals are formed on the substrate. The conductive rubber connector includes a non-conductive portion 39 with a nearly L-shaped cross section in which plural conductive fine wires bent in a nearly U-shaped form are buried at predetermined intervals. The fluorescent display tube is mounted on the upper surface of the printed board. The conductive rubber connector is placed at a predetermined position. The fluorescent display tube and the conductive rubber connector are fixed by means of a fixture. The external terminals of the fluorescent display tube is electrically connected to the connection terminals of the printed board via the conductive rubber connector.

9 Claims, 5 Drawing Sheets

DISPLAY DEVICE HAVING ANGLED CONNECTOR

BACKGROUND OF THE INVENTION

1. Field of the Invention

This invention relates to a display panel in which a display element is assembled on a printed board, and more particularly to a connection structure in which external terminals of a display element are connected with connection terminals of a printed board.

2. Description of the Related Art

Figure 7:
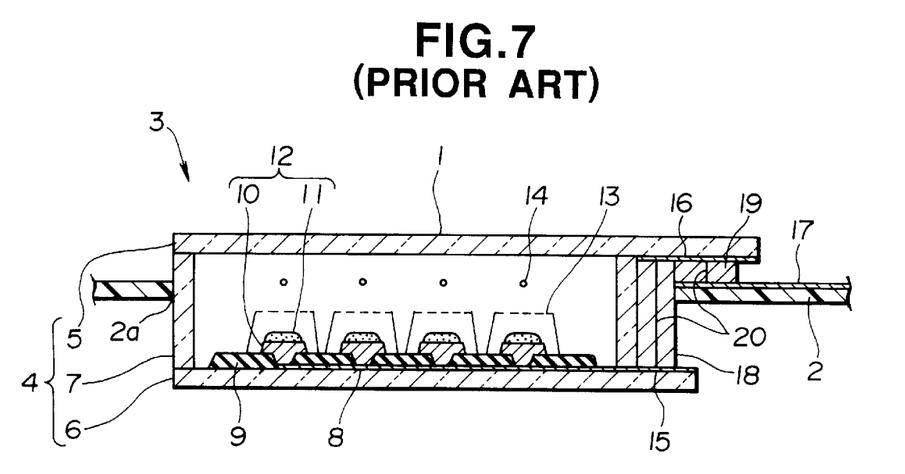
FIG. 7 is a cross-sectional view showing a conventional display panel.

FIG. 7 is a cross-sectional view showing a conventional fluorescent display panel 3 in which a fluorescent display tube is assembled on the printed board 2. The fluorescent display tube 1 generally has a box-like container 4. The container 4 consists of a front substrate 5 and a base substrate confronting each other in parallel, and a frame-like side plate 7 sandwiched between the substrates 5 and 6 and disposed at the outer periphery thereof. These plate members are securely bonded with a glass sealing agent. Conventionally, a side portion of the base substrate 6 protrudes outward from the side plate 7. The side portion of the front substrate 5 confronting the side portion of the base substrate 6 protrudes outward longer than the side portion of the base substrate 6. Eight wiring conductors are arranged on the inner surface of the base substrate 6. Insulating layers 9 are formed on the wiring conductors 8. The anode conductors 10 formed on the insulating layer 9 are connected to the wiring conductors 8 via the conductors formed in the through holes in the insulating layer 9. Fluorescent substance layers 11 are respectively coated on the anode conductors 10. The anode electrodes 12 are formed as a light emitting display portion. Control electrodes 13 are formed over each of the anode electrode 12. Filament cathodes 14 are suspended over the control electrodes 13.

Various electrodes formed on the base substrate 6 are extracted outward from the container 4 via the wiring conductors 8 formed on the base substrate 6. The wiring conductors extend on the inner surface of the base substrate 6 protruded from the container 4 to form first external electrodes 15. Second external terminals 15 confronting the first external electrodes 15 are formed on the inner surface of the side portion of the front substrate 5. The external terminals 15 correspond to plural linear wiring conductors arranged at predetermined intervals while the external terminals 16 correspond to plural linear wiring conductors arranged at predetermined intervals.

Figure 8:
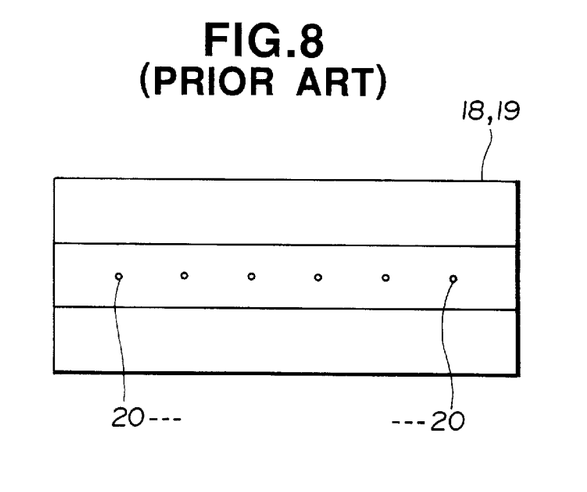
FIG. 8 is a front view showing a conductive member used in a conventional display panel.

Connection terminals 17 are formed on the upper surface of the printed board 2. The connection terminals 17 are formed of wiring conductors which are arranged in the same pitch as that of the external terminals 15 and 16 of the fluorescent display tube 1 and are the same in number as that thereof. The fluorescent display tube 1 is electrically connected to the printed board 2 via two conductive rubber connectors 18 and 19. The conductive rubber connectors 18 and 19, as shown in FIG. 8, have a three layered structure, respectively. Plural conductive fine wires are buried in the intermediate layer of a nearly rectangular silicone rubber at predetermined intervals. In the fine wires 20, one end protrudes from the upper surface of the rectangular silicone rubber while the other end protrudes from the lower surface thereof.

The fluorescent display tube 1 is inserted in the mounting hole 2a formed in the printed board 2. The first conductive rubber connector 10 is sandwiched between the base substrate 6 and the front substrate 5 protruded from the outer surface of the container 4 of the fluorescent display tube 1. The first conductive rubber connector 18 electrically conducts the first external terminal 15 to the second external terminal 16. The second conductive rubber connector 19 is sandwiched between the front substrate 5 and the printed board 2 and is disposed adjacent to the first conductive rubber connector 18. The second conductive rubber connector 19 is thinner than the first conductive rubber connector 18 but has the same structure as that thereof. The second conductive rubber connector 19 electrically conducts the second external terminal 16 to the connection terminal 17 formed on the printed board 2.

However, the conventional fluorescent display panel 3 has the disadvantage in that since the fluorescent display tube 1 protrudes outward from both sides of the printed board 2, the compressing mechanism becomes complicated to establish an electrical connection between the conductive rubber connector 18 and 19 and the fluorescent display tube 1 and the printed board 2. Moreover, there is the problem in that external terminals must be further disposed on the front substrate 6, in addition to the base substrate 6. There is the problem in that since two conductive rubber connectors 18 and 19 establish an electrical connection between the base substrate 6, the front substrate, and the printed board 2 at four spots, conduction failure occurs with high probability.

SUMMARY OF THE INVENTION

The present invention is made to overcome the above-mentioned problems. It is the object of the invention is to provide a display panel which can reduce the number of external terminals on a fluorescent display tube and has its simplified assembly structure difficult to cause conduction failure.

According to the present invention, a display panel comprises a display element having external terminals electrically connected to internal electrodes therein; a mounting body securely fixed to the display element and having connection terminals which are connected to the external terminals of the display element; and a conductive member formed of a non-conductive portion of a flexible member and an angled conductive portion and electrically connecting the external terminals of the display panel to the connection terminals of the mounting body.

According to the present invention, a display panel comprises a display element having external terminals electrically connected to internal electrodes therein; a mounting body having connection terminals which are connected to the external terminals of the display element; a conductive member formed of a non-conductive portion of a flexible member and an angled conductive portion and electrically connecting the external terminals of the display element to the connection terminals of the mounting body; and a fixture for mounting the display element on the mounting body to fix the conductive member on the display element and the mounting body.

The non-conductive portion of the conductive member includes a first contact member in contact with the external terminals of the display element and a second contact portion in contact with the connection terminals of the mounting body. The conductive portion of the conductive member comprises plural wires arranged at predetermined intervals inside the non-conductive portion and having both ends protruding from the first contact portion and the second contact portion.

The conductive portion of the conductive member comprises plural wires continuously arranged on the outer surface of two adjacent contact portions of the non-conductive portion at predetermined intervals.

Moreover, according to the present invention, a display panel comprises a fluorescent display tube in which part of a substrate forming a container protrudes outward, the substrate having plural external terminals formed on the upper surface of the part thereof at predetermined intervals to connect electrically to electrodes inside the container; a printed board to which the substrate of the fluorescent display tube is mounted, the printed board having plural connection terminals to be connected to the plural external terminals of the fluorescent display tube, the plural connection terminals being arranged on the upper surface of the printed board at predetermined intervals; a conductive member having a nonconductive portion of a flexible member including a first contact portion in contact with the upper surface of the substrate of the fluorescent display tube and a second contact portion in contact with the upper surface of the printed substrate, and a conductive portion in an angled form arranged in the non-conductive portion to connect electrically the external terminals of the fluorescent display tube to the connection terminals of the printed substrate; and a fixture for mounting the fluorescent display tube on the printed board to fix the conductive member to the fluorescent display tube and the printed board.

The first contact portion and the second contact portion of the nonconductive portion are arranged substantially in parallel, the first contact portion being a contact surface, the second contact portion being a second contact surface. The conductive portion comprises plural wires in a nearly U-shaped form which are arranged inside the non-conductive portion at predetermined intervals, the plural wires respectively having one end protruding from the first contact surface and the other end protruding from the second contact surface.

The first contact portion and the second contact portion of the nonconductive portion are on the same plane. The conductive portion comprises plural wires in a nearly U-shaped form which are arranged inside the non-conductive portion at predetermined intervals, the plural wires respectively having one end protruding from the first contact surface and the other end protruding from the second contact surface.

The first contact portion and the second contact portion of the non-conductive portion are adjacent to each other but are not arranged substantially in parallel, the first contact portion being a first contact surface, the second portion being a second contact surface. The conductive portion comprises plural wires which are arranged inside the non-conductive portion at predetermined intervals and are bent at least at one spot so as to protrude both ends thereof from the first contact surface and the second contact surface.

The conductive portion of the conductive member comprises plural strip fine wires which are continuously arranged on two adjacent contact surfaces of the non-conductive portions at predetermined intervals.

The above and other objects, features and advantages of the present invention will become apparent from the following description when taken in conjunction with the accompanying drawings which illustrate preferred embodiments of the present invention by way of example.

DETAILED DESCRIPTION OF THE PREFERRED EMBODIMENTS

Figure 1:
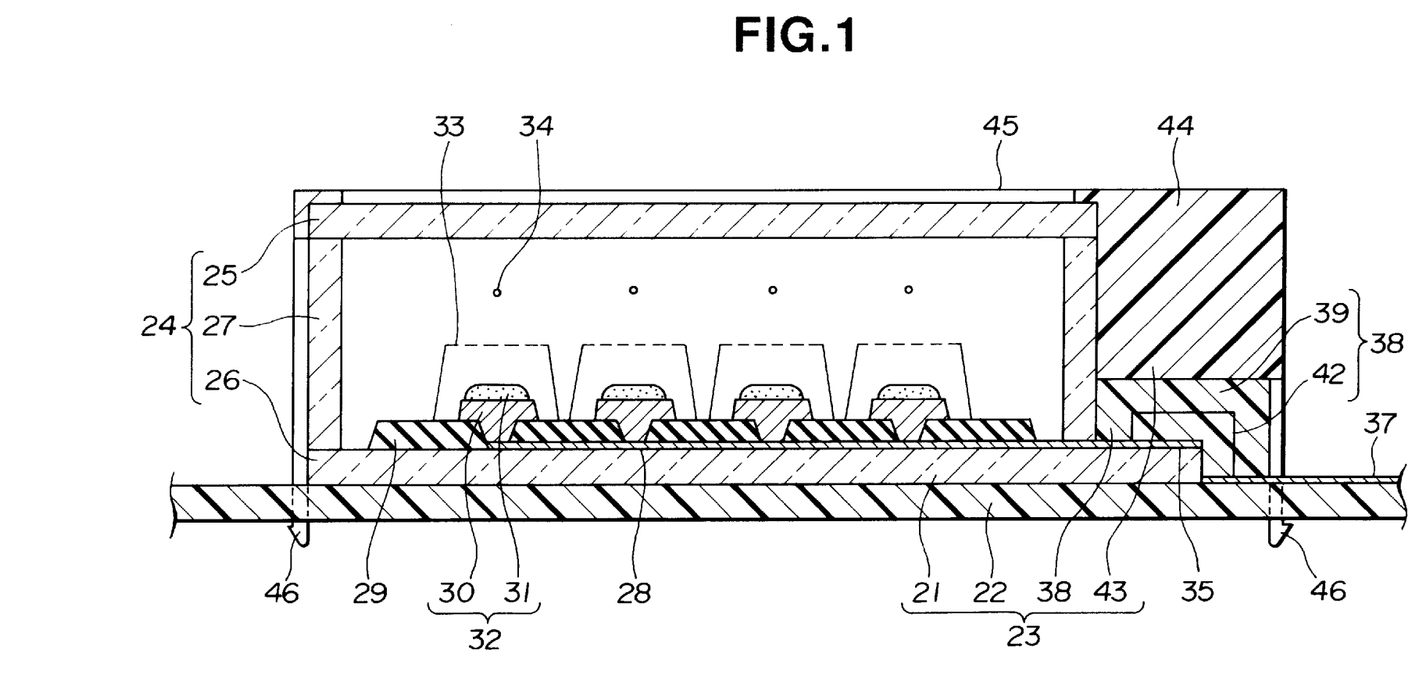
FIG. 1 is a cross-sectional view showing a display panel according to a first embodiment of the present invention.

The embodiments according to the present invention will now be described below in detail with reference to the attached drawings. A first embodiment will be described with reference to FIGS. 1 and 2. FIG. 1 is a cross-sectional view showing a display panel 23 in which a fluorescent display tube 21 acting as a display device is assembled on the printed board 22 acting as a mounting body. The fluorescent display tube 21 has a nearly box-like container 24. The container 24 includes a front substrate 25, a base substrate 26 confronting in parallel the front substrate 25, and a frame-like side plate 27 sandwiched between the outer peripheries of the substrates 25 and 26. These plates are securely fixed with a glass sealing agent. In the present embodiment, one side portion of the base substrate 26 protrudes outward from the side plate 27.

Wiring conductors 28 are formed on the inner surface of the base substrate 26. An insulating layer 29 is formed on the wiring conductors 28. Anode conductors 30 formed on the insulating layer 29 are connected to the wiring conductors 30 via the conductors in the through holes formed in the insulating layer 29. A fluorescent substance layer 31 is coated on each of the anode conductors 30. The combination of the anode conductor 30 and the fluorescent substance layer 31 configures an anode 32 acting as a light-emitting display portion. A control electrode 33 is formed over each of the anodes 32. Filament cathodes 34 are suspended over the control electrodes 32.

Various electrodes formed on the base substrate 26 are extracted from the container 24 via the wiring conductors 28 formed on the base substrate 26. These wiring conductors extend over the inner surface of the base substrate 26 outside the container 24 and act as external terminals 35. The external terminals 35 are plural linear wiring conductors arranged in parallel at predetermined intervals. In this embodiment, the external terminals 35 are made of an aluminum thin film.

Connection terminals 37 are formed on the upper surface of the printed board 22. The conductor terminals 37 are wiring conductors of aluminum thin films which have the same pitch as that of the external terminals 35 of the fluorescent display tube 21 and are the same in number as the external terminals 35.

Figure 2:
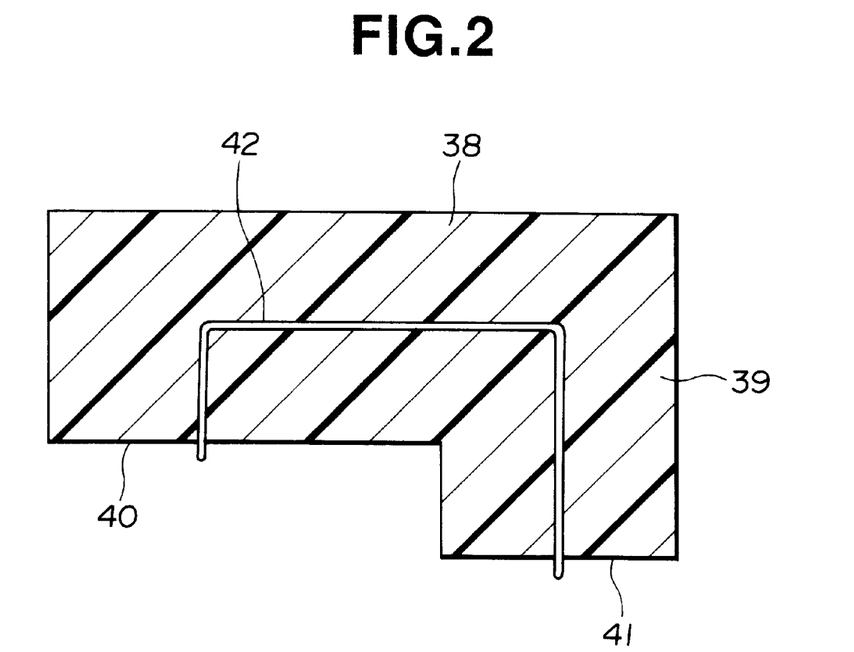
FIG. 2 is a cross-sectional view showing a non-conductive member according to a first embodiment of the present invention.

The fluorescent display tube 21 is connected to the printed board 22 via a sole conductive rubber connector 38 being a conductive member. As shown in FIGS. 1 and 2, the conductive rubber connector 38 includes a non-conductive rubber connector 39 made of a silicone rubber of a flexible non-conductive substance. The non-conductive portion 39 has a nearly L-shaped cross section and has two lower contact surfaces (contact portions) 40 and 41 arranged in parallel and unevenly stepped. The two contact surfaces 40 and 41 are in contact with the upper surface of the base substrate 26 of the fluorescent display tube 21 and the upper surface of the printed board 22. Plural conductive fine wires 42 are buried as a conductive portion in the non-conductive portion 39 at predetermined intervals. Each of the fine wires 42 has two angled portions in a nearly U-shaped form. The shorter end of the fine wire 42 protrudes from the first contact surface 40 which contacts with the base substrate 26 of the fluorescent display tube 21. The longer end of the fine wire 42 protrudes from the second contact surface 41 which contacts with the printed board 22.

As shown in FIG. 1, the fluorescent display tube 21 is disposed at a predetermined position on the upper surface of the printed board 22. The conductive rubber connector 38 is disposed on the fluorescent display tube 21 and the printed board 22. The fixture 43 fixes the fluorescent display tube 21 and the conductive rubber connector 38 on the printed board 22. The fixture 43 has support legs 46 by which the connector holder 44 and the frame-like display tube holder 45 are fixed to the printed board 22. The fixture 43 is made of a resin with a certain elasticity and can securely fix the fluorescent display tube 21 and the conductive rubber connector 38 onto the printed board 22.

The fluorescent display tube 21 is fixed on the printed board 22 by means of the fixture 43. The fixture 43 presses the conductive rubber connector 38 against the upper surface of the base substrate 26 of the fluorescent display tube 21 and the upper surface of the printed board 22. The first contact surface 40 of the conductive rubber connector 38 contacts with the upper surface of the base substrate 26 to connect electrically one end of the fine wire 42 to the external terminals 35 of the fluorescent display tube 21. The second contact surface 41 of the conductive rubber connector 38 contacts with the upper surface of the printed board 22 to connect electrically the other end of the fine wire 42 to the connection terminals 37 of the printed board 22. The fine wire 42 of the conductive rubber connector 38 is made of a gold-plated brass wire harder than aluminum. The fine wire 42 butts against the external terminals 35 and the connection terminals 37 to obtain certain electrical connection.

Figure 3:
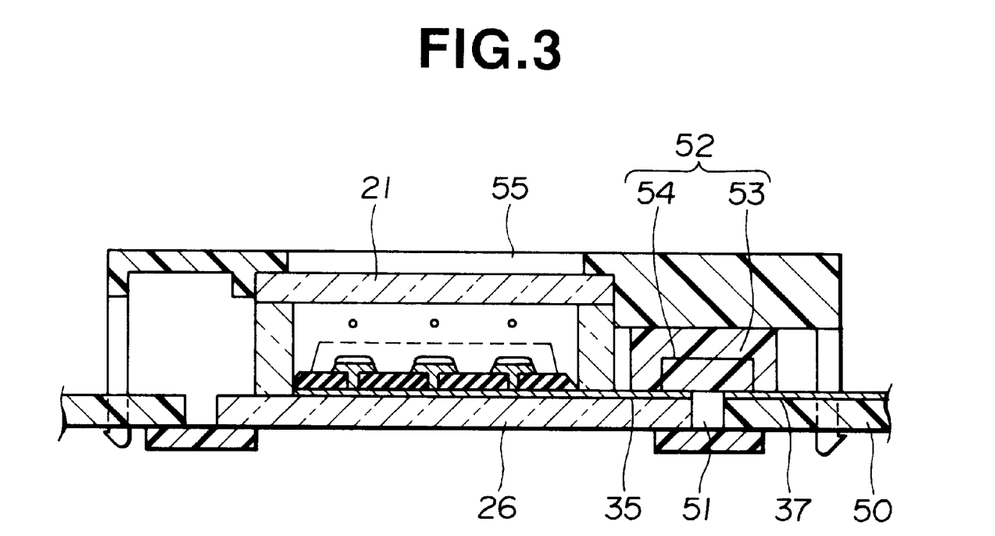
FIG. 3 is a cross-sectional view showing a display panel according to a second embodiment of the present invention.

The second embodiment of the present invention will be described below with reference to FIG. 3. Portions different in function and configuration from the first embodiment will be described chiefly here. Mounting holes 51 for the fluorescent display tube 51 are formed in the printed board 50. When the base substrate 26 of the fluorescent display tube 21 is inserted into the mounting hole 51, the upper surface of the base substrate 26 is leveled with the upper surface of the printed board 50. The conductive rubber connector 52 has the rectangular non-conductive portion 53 with the lower surface in contact with the upper surface of the base substrate 26 and the upper surface of the printed board 50. Conductive portion is formed of plural fine wires 54 in a nearly U-shaped form. The plural fine wires 54 are arranged in parallel inside the non-conductive portion 53 at predetermined intervals and have the ends protruded from the lower surface of the non-conductive portion 53.

The fluorescent display tube 21 is fixed on the printed board 50 by means of the fixture 55. The fixture 55 presses the lower surface of the conductive rubber connector 52 against the upper surface of the base substrate 26 of the fluorescent display tube 21 and the upper surface of the printed board 50. The conductive rubber connector 52 has one end of the fine wires 54 electrically connected to the external terminals 35 of the fluorescent display tube 21 and the other end electrically connected to the connection terminals 37 of the printed board 50.

Figure 4:
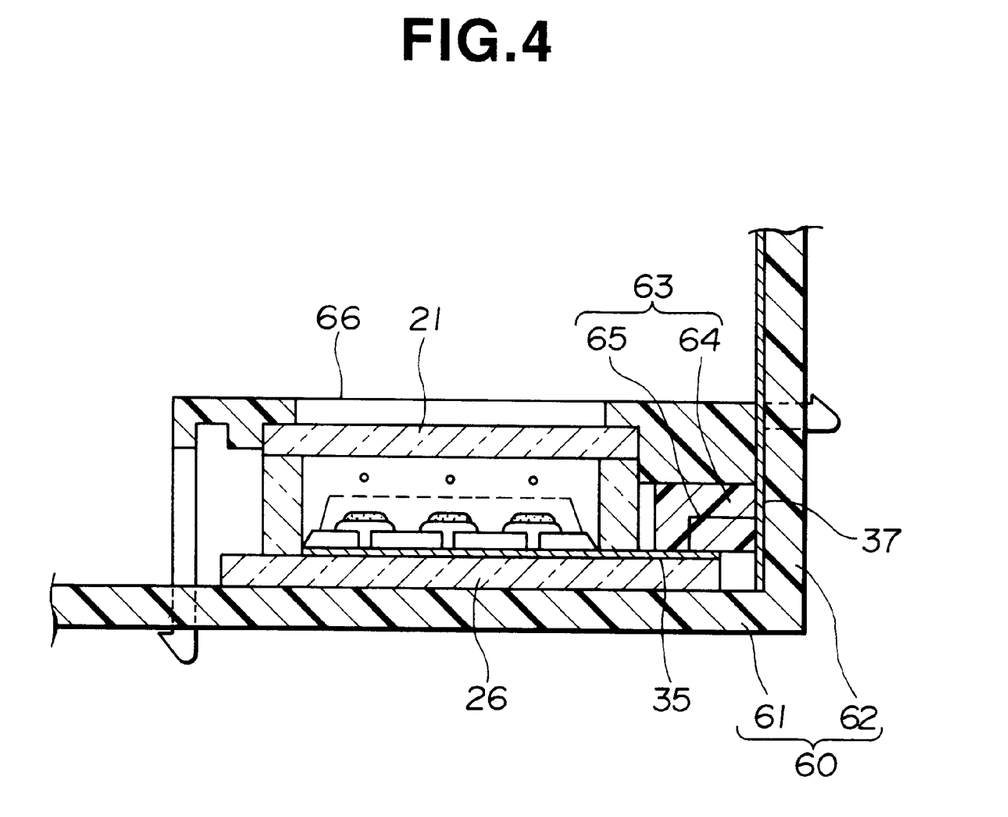
FIG. 4 is a cross-sectional view showing a printed board according to a third embodiment of the present invention.

The third embodiment of the present invention will be described below by referring to FIG. 4. Portions different in function from the first embodiment will be described chiefly here. The printed board 60 is formed of a horizontal portion 61 on which the fluorescent display tube is mounted and a vertical portion 62 with connection terminals 37. The horizontal portion is set up to the vertical portion at an angle of about 90. The conductive rubber connector 63 includes a non-conductive portion 64. The conductive rubber connector 63 has one end surface in contact with the upper surface of the base substrate 26 and the other end surface in contact with the upper surface of the vertical portion 62 of the printed board 60. The conductive portion is formed of plural fine wires 65 in a nearly U-shaped form which are arranged in parallel inside the non-conductive portion 64 at predetermined intervals and protrude from the lower end surface and the side end surface.

The fluorescent display tube 21 is fixed on the printed board 60 by means of the fixture 66. The fixture 66 presses the lower surface of the conductive rubber connector 63 against the upper surface of the base substrate 26 of the fluorescent display tube 21 and presses the side surface against the upper surface of the vertical portion 62 of the printed board 60. The fine wire 65 of the conductive rubber connector 63 has one end which contacts electrically with the upper surface of the external terminals 35 of the fluorescent display tube 21 and the other end which connects electrically with the connection terminals 37 of the printed board 60.

Figure 5:
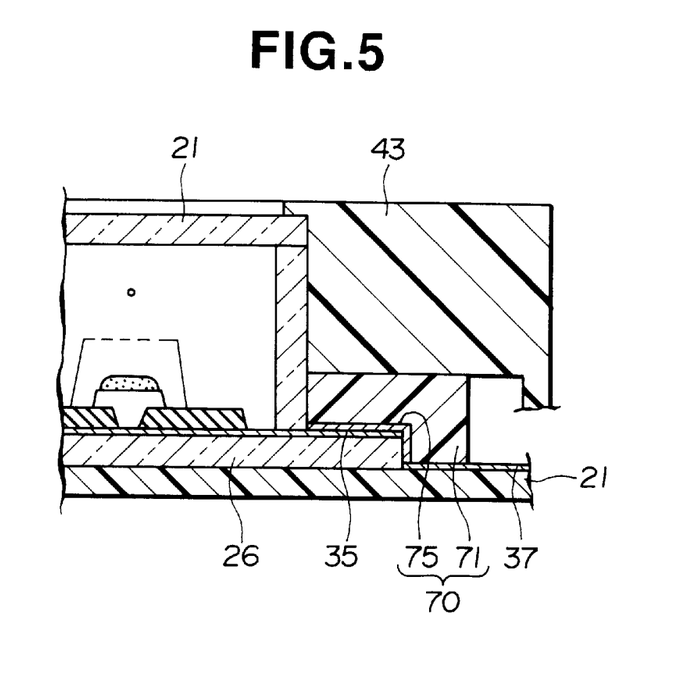
FIG. 5 is a cross-sectional view partially showing a display panel according to a fourth embodiment of the present invention.
Figure 6:
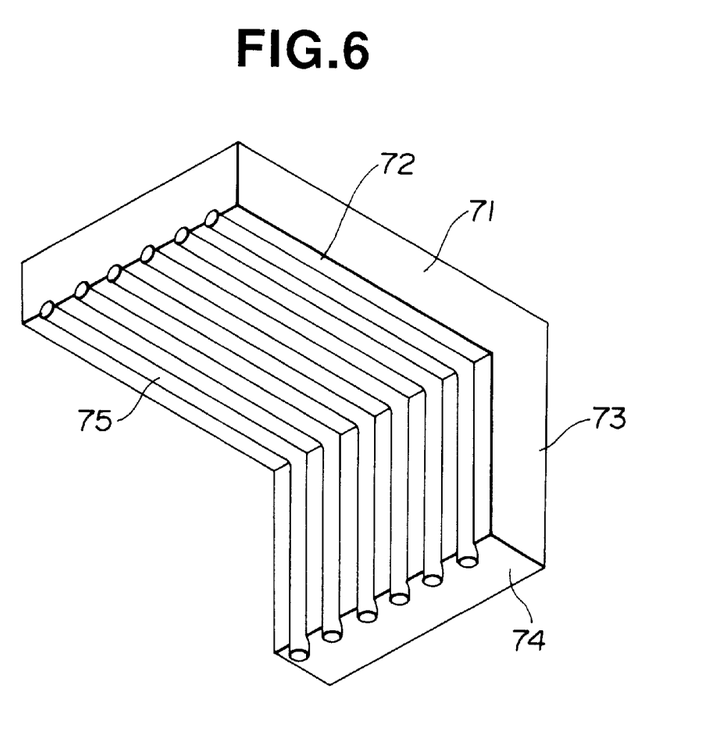
FIG. 6 is a perspective view showing a conductive member according to a fourth embodiment of the present invention.

Another embodiment of the present invention will be described below with reference to FIGS. 4, 5, and 6. The portion which is functionally and largely different from the first embodiment will be chiefly described. In the conductive rubber connector 70, the non-conductive portion 71 has a roughly L-shaped cross section and has three successive contact surfaces on the lower surface on the recessed side. The first contact surface 72 contacts with the upper surface of the base substrate 26 of the fluorescent display tube 21. The second contact surface 73 contacts with the side surface of the base substrate 26 of the fluorescent display tube 21. The third substrate 74 contacts with the upper surface of the printed board 21. The conductive portion of the conductive rubber connector 70 is plural strip-like fine wires 75 which are continuously arranged on the first contact surface 72 and the second contact surface 73 of the non-conductive portion 71 at predetermined intervals. The strip-like fine wires 75 are gold plated. The fine wires 75 may be formed in a strip form.

The fluorescent display element is fixed onto the printed board 21 by means of the fixture 43. The fixture 43 presses the first contact surface 72 of the conductive rubber connector 70 against the upper surface of the base substrate 26 of the fluorescent display tube 21 and the third contact surface 74 against the upper surface of the printed board 21. One end of the fine wires 75 of the conductive rubber connector 70 contacts with the external terminals 35 of the fluorescent display tubes while the other end thereof contacts with the connection terminals 37 of the printed board 21.

The embodiments described above relates to a fluorescent display panel. The present invention is applicable to any display elements independently of the glowing principle and the internal structure. The non-conductive portion of the conductive member may be a non-conductive flexible substance, without being restricted by silicone rubber. A suitable substance, if necessary, may be selected for the conductive portion of the conductive member. The display elements may be mounted on other electric equipment or the cabinet thereof, instead of the printed board.

According to the present invention, the conductive member having an angled conductive portion connects the external terminals of the display elements to the connection terminals to be mounted. Hence, there are the following advantages:

Means which connects the display element and the conductive member to an object to be mounted can be simplified. That is, the mechanism for compressing the conductive rubber connector can be simplified.

The display element can be mounted in short time.

Since the number of external terminals for the display element is decreased, the area of the glass substrate forming the container for a display element can be reduced. The reduced area result in thinning a product container, increasing the number of products stored in a product container, and reducing transportation costs.

The increase of the glass area is minimized. The ratio of the display area to the display tube area can be increased. The size of the whole system can be miniaturized.

The reduced number of conductive members leads to a decrease in the conductive points, so that the conductive failure occurrence ratio can be decreased.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A display panel comprising:
   a display element having external terminals electrically connected to internal electrodes therein;
   a mounting body securely fixed to said display element and having connection terminals which are connected to said external terminals of said display element; and
   a conductive member formed of a non-conductive portion of a flexible member and an angled conductive portion and electrically connecting said external terminals of said display panel to said connection terminals of said mounting body.

2. A display panel comprising:
   a display element having external terminals electrically connected to internal electrodes therein;
   a mounting body having connection terminals which are connected to said external terminals of said display element;
   a conductive member formed of a non-conductive portion of a flexible member and an angled conductive portion and electrically connecting said external terminals of said display element to said connection terminals of said mounting body; and
   a fixture for mounting said display element on said mounting body to fix said conductive member on said display element and said mounting body.

3. The display panel defined in claim 2, wherein said non-conductive portion of said conductive member includes a first contact member in contact with said external terminals of said display element and a second contact portion in contact with said connection terminals of said mounting body; and wherein said conductive portion of said conductive member comprises plural wires arranged at predetermined intervals inside said non-conductive portion and having both ends protruding from said first contact portion and said second contact portion.

4. The display panel defined in claim 2, wherein said conductive portion of said conductive member comprises plural wires continuously arranged on the outer surface of two adjacent contact portions of said non-conductive portion at predetermined intervals.

5. A display panel comprising:
   a fluorescent display tube in which part of a substrate forming a container protrudes outward, said substrate having plural external terminals formed on the upper surface of said part thereof at predetermined intervals to connect electrically to electrodes inside said container;
   a printed circuit board to which said substrate of said fluorescent display tube is mounted, said printed circuit board having plural connection terminals to be connected to said plural external terminals of said fluorescent display tube, said plural connection terminals being arranged on the upper surface of said printed circuit board at predetermined intervals;
   a conductive member formed of a non-conductive portion of a flexible member including a first contact portion in contact with the upper surface of said substrate of said fluorescent display tube and a second contact portion in contact with the upper surface of said substrate, and an angled conductive portion arranged in said non-conductive portion to connect electrically the external terminals of said fluorescent display tube to said connection terminals of said substrate; and
   a fixture for mounting said fluorescent display tube on said printed circuit board to fix said conductive member to said fluorescent display tube and said printed circuit board.

6. The display panel defined in claim 5, wherein said first contact portion and said second contact portion of said non-conductive portion are arranged substantially in parallel, said first contact portion being a contact surface, said second contact portion being a second contact surface; and wherein said conductive portion comprises plural wires in a nearly U-shaped form which are arranged inside said non-conductive portion at predetermined intervals, said plural wires respectively having one end protruding from said first contact surface and the other end protruding from said second contact surface.

7. The display panel defined in claim 5, wherein said first contact portion and said second contact portion of said non-conductive portion are on the same plane; and wherein said conductive portion comprises plural wires in a nearly U-shaped form which are arranged inside said non-conductive portion at predetermined intervals, said plural wires respectively having one end protruding from said first contact surface and the other end protruding from said second contact surface.

8. The display panel defined in claim 5, wherein said first contact portion and said second contact portion of said non-conductive portion are adjacent to each other but are not arranged substantially in parallel, said first contact portion being a first contact surface, said second portion being a second contact surface; and wherein said conductive portion comprises plural wires which are arranged inside said nonconductive portion at predetermined intervals and are bent at least at one spot so as to protrude both ends thereof from said first contact surface and said second contact surface.

9. The display panel defined in claim 5, wherein said conductive portion of said conductive member comprises plural strips of fine wires which are continuously arranged on two adjacent contact surfaces of said nonconductive portions at predetermined intervals.

* * * * *